(12) United States Patent
Kim et al.

(10) Patent No.: US 6,639,868 B2
(45) Date of Patent: Oct. 28, 2003

(54) SDRAM HAVING DATA LATCH CIRCUIT FOR OUTPUTTING INPUT DATA IN SYNCHRONIZATION WITH A PLURALITY OF CONTROL SIGNALS

(75) Inventors: Kyu-Hyoun Kim, Kyungki-do (KR); Dae-Hyun Chung, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/112,108

(22) Filed: Mar. 28, 2002

(65) Prior Publication Data

US 2002/0172090 A1 Nov. 21, 2002

(30) Foreign Application Priority Data

May 15, 2001 (KR) .................................. 10-2001-26418

(51) Int. Cl.[7] .................................................. G11C 8/00
(52) U.S. Cl. .................. 365/233; 365/194; 365/189.05
(58) Field of Search ............................ 365/233, 189.05, 365/194, 230.01, 189.08; 327/202, 203, 204

(56) References Cited

U.S. PATENT DOCUMENTS 5,844,858 A * 12/1998 Kyung ........................ 365/233
6,064,625 A * 5/2000 Tomita ........................ 365/233
6,078,546 A * 6/2000 Lee ............................. 365/233
6,151,272 A * 11/2000 La et al. ..................... 365/233
6,292,410 B1 * 9/2001 Yi et al. ...................... 365/193
6,320,819 B2 * 11/2001 Tomita et al. .............. 365/233

* cited by examiner

*Primary Examiner*—David Nelms
*Assistant Examiner*—Gene N. Auduong
(74) *Attorney, Agent, or Firm*—Marger Johnson & McCollom, P.C.

(57) ABSTRACT

A synchronous DRAM semiconductor device including a data latch circuit outputting input data responsive to with a plurality of control signals is provided. The synchronous DRAM semiconductor device includes a first buffer for buffering an external control signal and generating a first internal control signal. A second buffer buffers the external control signal and generating a second internal control signal. A third buffer buffers the external control signal and generates an internal clock signal. A data latch circuit receives external data sequentially synchronized with the first and second internal control signals and the internal clock signal. The synchronous DRAM semiconductor device can prevent the time margin window for outputting data from the data latch circuit.

13 Claims, 5 Drawing Sheets

SDRAM HAVING DATA LATCH CIRCUIT FOR OUTPUTTING INPUT DATA IN SYNCHRONIZATION WITH A PLURALITY OF CONTROL SIGNALS

BACKGROUND OF THE INVENTION

1. Field of the Invention

The present invention relates to a semiconductor memory device, and more particularly, to a synchronous Dynamic Random Access Memory (DRAM) semiconductor device having a data latch circuit for outputting input data synchronized with a plurality of control signals.

2. Description of the Related Art

Among synchronous dynamic random access memory (SDRAM) semiconductor devices, a double data rate (DDR) SDRAM semiconductor device includes a data latch circuit. The data latch circuit synchronizes input data with a control signal and a clock signal and outputs the synchronized input data.

FIG. 1 illustrates a synchronous DRAM semiconductor device including a data latch circuit. Referring to FIG. 1, a synchronous DRAM semiconductor device 101 includes a data latch circuit 11 including first through fifth flip-flops 61 through 65, respectively, and first, second, and third buffers 21, 41, and 51, respectively.

The first buffer 21 buffers an external control signal DQS, e.g., a data strobe signal, and generates a first internal control signal DQS_internal.

The second buffer 41 buffers an external clock signal CLK and generates an internal clock signal PCLK.

The third buffer 51 buffers external data DQ and outputs data input into the data latch circuit.

The first flip-flop 61 of the data latch circuit 11 synchronizes data received from the third buffer 51 with the rising edge of the internal control signal DQS_internal and outputs the synchronized data to the third flip-flop 63. The second flip-flop 62 synchronizes data received from the third buffer 51 with the falling edge of the internal control signal DQS_internal and outputs the synchronized data to the fifth flip-flop 65. The third flip-flop 63 synchronizes data received from the first flip-flop 61 with the falling edge of the internal control signal DQS_internal and outputs the synchronized data to the fourth flip-flop 64. When data is transmitted from the third flip-flop 63 to the fourth flip-flop 64, another data is simultaneously transmitted from the second flip-flop 62 to the fifth flip-flop 65. The fourth and fifth flip-flops 64 and 65, respectively, are synchronized with the rising edge of the internal clock signal PCLK and outputs data received from the second and third flip-flops 62 and 63, respectively. When the second and third flip-flops 62 and 63 output data to the fourth and fifth flip-flops 64 and 65, respectively, the first flip-flop 61 receives new data from the third buffer 51.

The data latch circuit 11 receives data from the third buffer 51 in synchronization with the rising and falling edges of the internal control signal DQS internal from the first buffer 21 and the rising edge of the internal clock signal PCLK. The data latch circuit 11 outputs even and odd data, DIN_E and DIN_O, respectively. Since the external control signal DQS and the internal clock signal PCLK have the same frequency, the frequency of each of the two data DIN_E and DIN_O becomes half the frequency of the data received from the third buffer 51, but the amount of the data output from the data latch circuit 11 is unchanged.

FIG. 2 is a timing diagram of the signals used in the data latch circuit 11 shown in FIG. 1. Referring to FIG. 2, the internal control signal DQS_internal is a signal generated by delaying the external control signal DQS for a first predetermined time interval, and the internal clock signal PCLK is a signal generated by delaying the external clock signal CLK for a second predetermined time interval. The time interval tCC indicates the frequency of the internal clock signal PCLK, and t1 and t2 indicate shift tolerance ranges to which the internal control signal DQS_internal can be shifted with respect to the internal clock signal PCLK. The time interval t3 indicates a design margin required for the design of a semiconductor device 101. The time intervals t4 and t5 indicate design factors considered as error ranges required for the design of the semiconductor device 101. The time interval t6 indicates a valid data window, that is, a range in which the internal clock signal PCLK can substantially latch data.

FIG. 3 is a diagram illustrating a synchronous DRAM semiconductor device including 4 data latch circuits. Referring to FIG. 3, data latch circuits 311 through 314 of a synchronous DRAM semiconductor device 301 each have one internal control signal, e.g., DSO_DS3. Thus, 4 internal control signals are needed for the four data latch circuits 311 through 314.

In the synchronous DRAM semiconductor devices 101 and 301 shown in FIGS. 1 and 3, respectively, the clock buffer 41 generating the internal clock signal PCLK internally makes and uses a short pulse for the purpose of obtaining a sufficient design margin. The control buffer 21 generates a pulse having the same duty cycle as the external control signal DQS. The internal clock signal PCLK is commonly input into the four data latch circuits 311 through 314. The internal control signal DQS_internal, however, is input into the four data latch circuits 311 through 314 along different paths. Thus, the line load between each of the four data latch circuits 311 through 314 differs. Accordingly, the structure and size of the clock buffer 41 are different from those of the control buffer 21. As a result, there is a difference between the time taken to generate the internal control signal DQS_internal after the external control signal DQS is input into the control buffer 21, the time taken to generate the internal clock signal PCLK after the external clock signal CLK is input into the clock buffer 41, and the time taken for each of the signals to reach the data latch circuit 11. In addition, since the above signals are affected differently by changes in process, voltage, and temperature, the time difference might further increase. As described above, since the time when the internal control signal DQS_internal occurs and the time when the internal clock signal PCLK occurs differ, the valid data window t6 decreases.

The phenomenon described above occurs more severely in high frequency semiconductor devices using high frequency signals. Thus, the line load of the internal control signal DQS_internal and the internal clock signal PCLK are designed to be about the same. In the synchronous semiconductor device including the four data latch circuits 311 through 314, four internal control signals must be designed to latch 32 input data, 8 input data each data latch circuit. However, to make the line load of each of the internal control signals the same as the line load of the internal clock signal PCLK, capacitors must be added to every path of the internal control signals, thereby increasing the area of the device.

SUMMARY OF THE INVENTION

It is an object of the present invention to overcome the disadvantages associated with prior art semiconductor devices.

It is another object of the present invention to provide a synchronous DRAM semiconductor device that is capable of maximizing a valid data window and minimizing an increase in the area of the device.

Accordingly, to achieve the above object, there is provided a synchronous DRAM semiconductor device including a first buffer adapted to generate a first internal control signal by buffering an external control signal. A second buffer is adapted to generate a second internal control signal by buffering the external control signal. A third buffer is adapted to generate an internal clock signal by buffering an external clock signal. A data latch circuit is adapted to receive external data and generate output data responsive to the first and second internal control signals and the internal clock signal.

A phase of the second internal control signal lags a phase of the first internal control signal.

The second and third buffers might have identical structures.

The data latch circuit includes first and second flip flops adapted to commonly receive internal data responsive to the first internal control signal. A third flip flop is adapted to receive data output from the first flip flop responsive to the second internal control signal. A fourth flip flop is adapted to receive data output from the second flip flop responsive to the second internal control signal. A fifth flip flop is adapted to receive data output from the third flip flop responsive to the internal clock signal. And a sixth flip flop is adapted to receive data output from the fourth flip flop responsive to the internal clock signal. The third and fourth flip flops might operate responsive to a falling edge of the second internal control signal. The fifth and sixth flip flops might operate responsive to a rising edge of the internal clock signal.

The data latch might alternatively include a first and second flip flops adapted to commonly receive internal data responsive to the first internal control signal. A seventh flip flop is adapted to receive data output from the first flip flop responsive to first internal control signal. A third flip flop is adapted to receive data output from the seventh flip flop responsive to the second internal control signal. A fourth flip flop is adapted to receive data output from the second flip flop responsive to the second internal control signal. A fifth flip flop is adapted to receive data output from the third flip flop responsive to the internal clock signal. And a sixth flip flop is adapted to receive data output from the fourth flip flop responsive to the internal clock signal. The third and fourth flip flops might operate responsive to a falling edge of the second internal control signal. The fifth and sixth flip flops might operate responsive to a rising edge of the internal clock signal. The seventh flip flop is synchronized with a falling edge of the second internal control signal.

A load of the second internal control signal from the second buffer to the data latch circuit is identical to a load of the internal clock signal from the third buffer to the data latch circuit.

A path of the second internal control signal from the second buffer to the data latch circuit is identical to a path of the internal clock signal from the third buffer to the data latch circuit.

BRIEF DESCRIPTION OF THE DRAWINGS

The above object and advantages of the present invention will become more readily apparent by describing in detail preferred embodiments thereof with reference to the attached drawings.

DETAILED DESCRIPTION OF THE INVENTION

Figure 1:
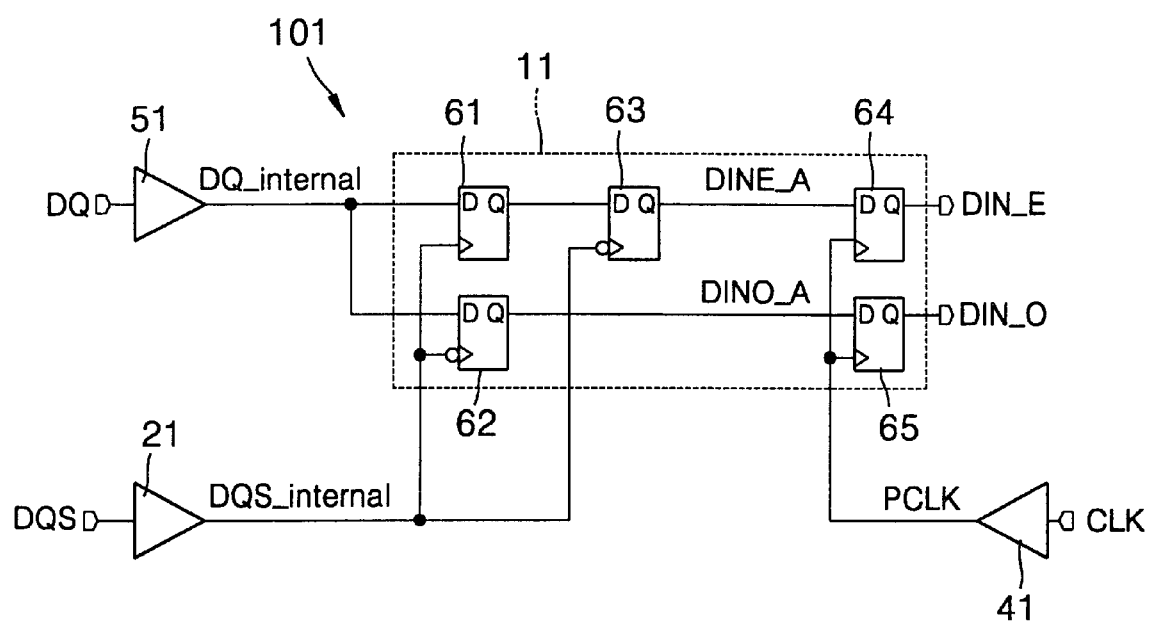
FIG. 1 is a block diagram of a synchronous DRAM semiconductor device.
Figure 2:
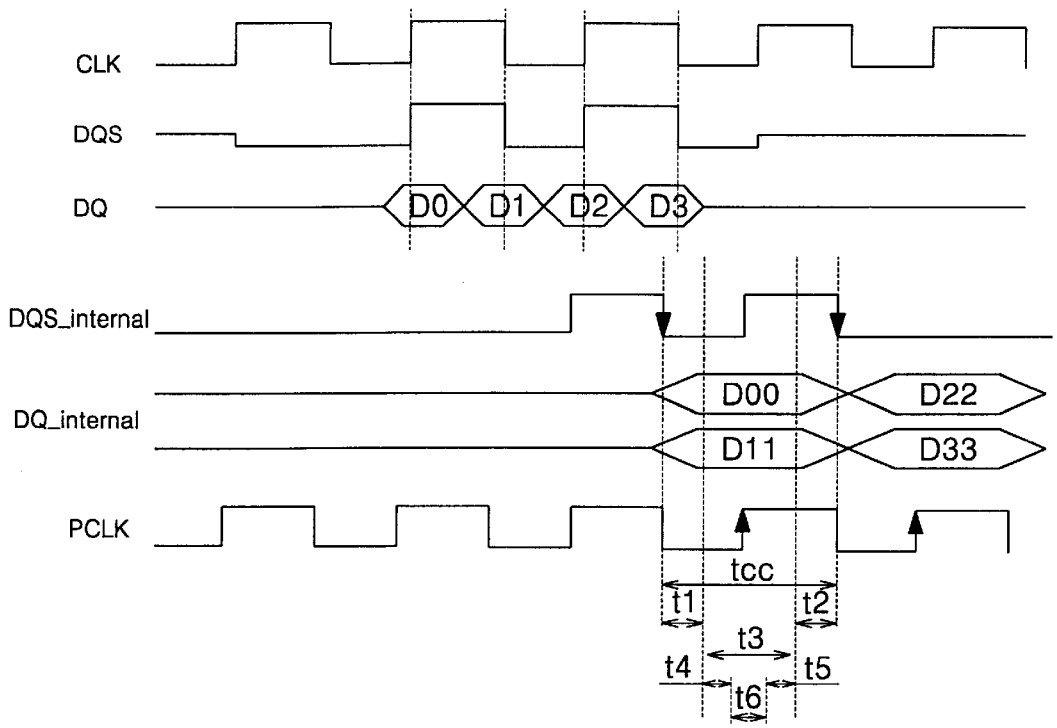
FIG. 2 is a timing diagram of the signals shown in FIG. 1.
Figure 3:
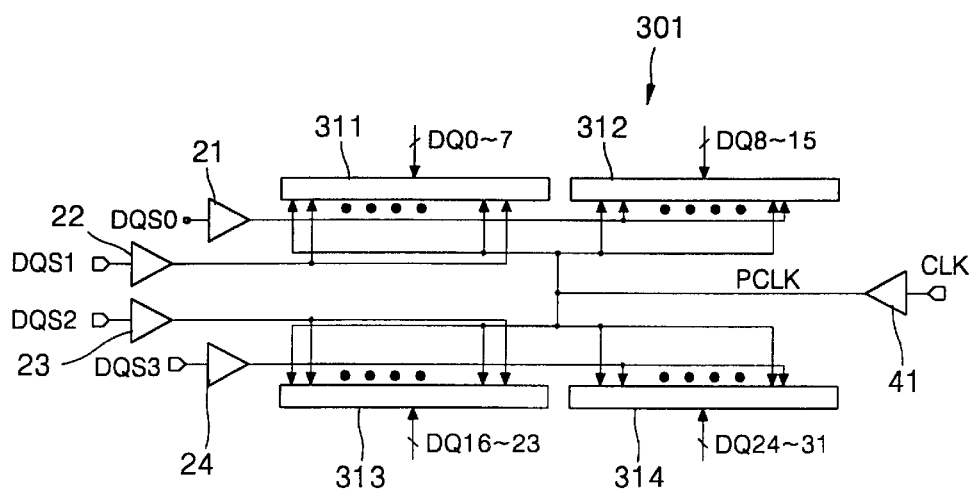
FIG. 3 is a block diagram of another synchronous DRAM semiconductor device.

The present invention will now be described more fully with reference to the accompanying drawings, in which preferred embodiments of the invention are shown. The same reference numerals in different drawings represent the same element.

Figure 4:
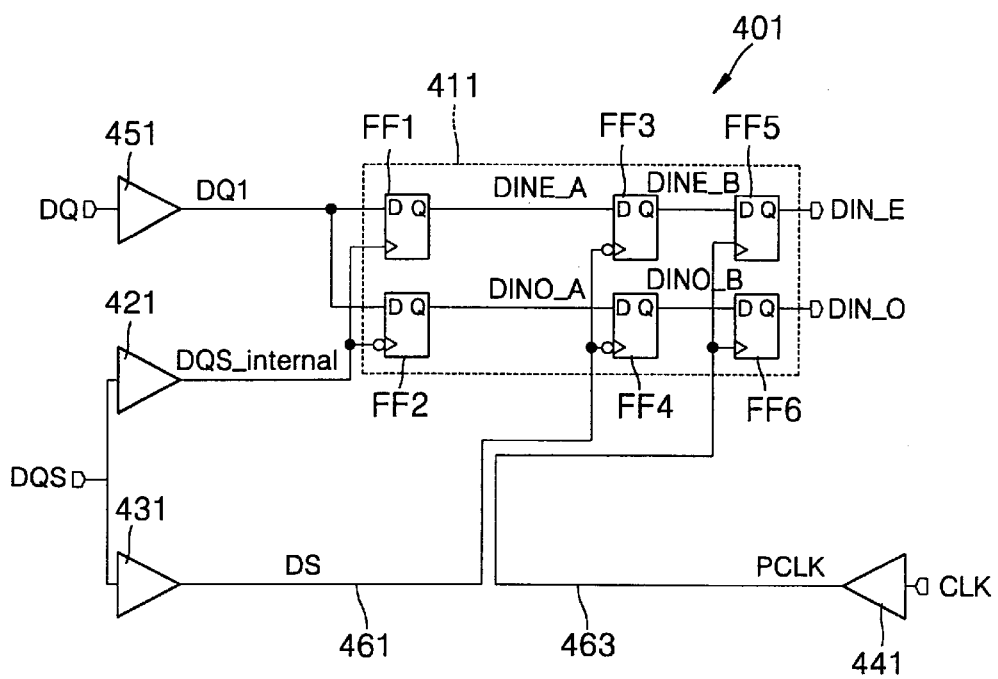
FIG. 4 is a block diagram of a synchronous DRAM semiconductor device according to a first embodiment of the present invention.

FIG. 4 is a block diagram of a synchronous DRAM semiconductor device 401 according to a first embodiment of the present invention. Referring to FIG. 4, a synchronous DRAM semiconductor device 401 includes a data latch circuit 411, and first, second, third, and fourth buffers 421, 431, 441, and 451.

The first buffer 421 buffers an external control signal DQS, e.g., a data strobe signal, and generates a first internal control signal DQS_internal.

The second buffer 431 buffers the external control signal DQS and generates a second internal control signal DS. After a predetermined time from when the first internal control signal DQS_internal reaches the data latch circuit 411, the second internal control signal DS reaches the data latch circuit 411.

The third buffer 441 buffers an external clock signal CLK and generates an internal clock signal PCLK. The third buffer 441 might have an identical structure as the second buffer 431. In other words, the second and third buffers 431 and 441, respectively, are designed to have the same structure so that the second internal control signal DS varies as much as the internal clock signal PCLK. If the internal clock signal PCLK varies with changes to a manufacturing process, voltage, or temperature, the second internal control signal DS also varies by the same amount that the internal clock signal PCLK varies.

A line 461 by which the second buffer 431 is connected to the data latch circuit 411 and a line 463 by which the third buffer 441 is connected to the data latch circuit 411 are designed along identical paths. As a result, the line load of the second internal control signal DS is equal to the line load of the internal clock signal PCLK thereby preventing a decrease in the valid data window due to a difference in line load.

The fourth buffer 451, which is a data input buffer, buffers external data DQ and generates internal data DQ1.

The data latch circuit 411 inputs the internal data DQ1 and is sequentially synchronized with the first and second internal control signals DQS_internal and DS, respectively, and the internal clock signal PCLK, the data latch circuit 411 latches the internal data DQ1. The data latch circuit 411 includes first through sixth flip-flops FF1 through FF6.

The first and second flip-flops FF1 and FF2 receive and latch the internal data DQ1, are synchronized with the first internal control signal DQS_internal, and output data DINE_A and DINO_A to the third and fourth flip-flops FF3 and FF4, respectively. In other words, the first flip-flop FF1 outputs the data DINE_A to the third flip-flop FF3 responsive to the rising edge of the first internal control signal DQS_internal. Likewise, the second flip-flop FF2 outputs the data DINO_A to the fourth flip-flop FF4 is responsive to the falling edge of the first internal control signal DQS_internal.

The third and fourth flip-flops FF3 and FF4, respectively, receive and latch the data DINE_A and DINO_A output from the first and second flip-flops FF1 and FF2, respectively, responsive to the falling edge of the second internal control signal DS, and output data DINE_B and DINO_B to the fifth and sixth flip-flops FF5 and FF6, respectively.

The fifth and sixth flip-flops FF5 and FF6 receive the data DINE_B and DINO_B output from the third and fourth flip-flops FF3 and FF4, respectively, responsive to the rising edge of the internal clock signal PCLK, and outputs data DIN_E and DIN_O.

Figure 5:
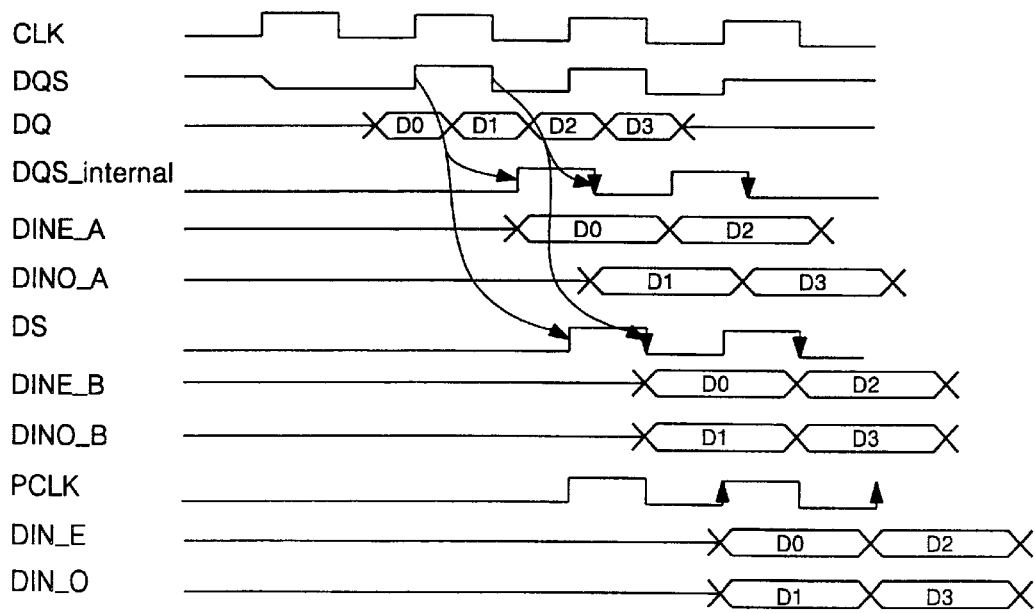
FIG. 5 is a timing diagram of the signals shown in FIG. 4.

FIG. 5 is a timing diagram of the signals shown in FIG. 4. Referring to FIG. 5, the data DINE_A is output responsive to the rising edge of the first internal control signal DQS_internal. The data DINO_A is output responsive to the falling edge of the first internal control signal DQS_internal. The data DINE_B and DINO_B are output responsive to the falling edge of the second internal control signal DS. The data DIN_E and DIN_O are output responsive to the rising edge of the internal clock signal PCLK.

The falling edge of the second internal control signal DS may be somewhere between two adjacent falling edges of the first internal control signal DQS_internal. Preferably, the falling edge of the second internal control signal DS is between the falling and rising edges of the first internal control signal.

As shown in FIG. 5, no decrease in the valid data window exist because the phase of the second internal control signal DS is the same as that of the internal clock signal PCLK. Accordingly, a margin in which data latched by the data latch circuit 411 can be synchronized with the internal clock signal PCLK increases.

Figure 6:
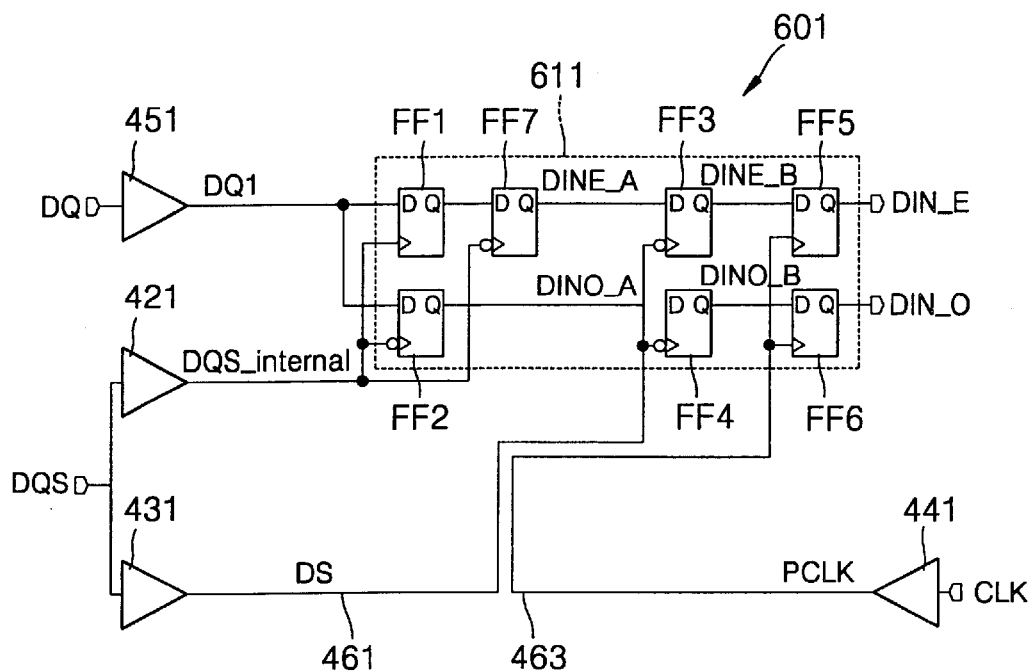
FIG. 6 is a block diagram of a synchronous DRAM semiconductor device according to a second embodiment of the present invention.

FIG. 6 is a block diagram of a synchronous DRAM semiconductor device according to a second embodiment of the present invention. The structure of a semiconductor device 601 shown in FIG. 6 is the same as that of the semiconductor device 401 shown in FIG. 4, except that a data latch circuit 611 in the semiconductor device 601 further includes a seventh flip-flop FF7. The seventh flip-flop FF7 latches data received from the first flip-flop FF1, responsive to the falling edge of the first internal control signal DQS. The seventh flip-flop FF7 outputs the data DINE_A to the third flip-flop FF3. In the data latch circuit 611 of FIG. 6, unlike the data latch circuit 411 of FIG. 4, the falling edge of the second internal control signal DS must be between falling edge and rising edges of the first internal signal DQS_internal.

The flip-flops FF1 through FF7 included in the data latch circuits 411 and 611 can operate responsive to or in synchronization with the rising or falling edge of any of the first and second internal control signals DQS_internal and DS, respectively, and the internal clock signal PCLK.

Figure 7:
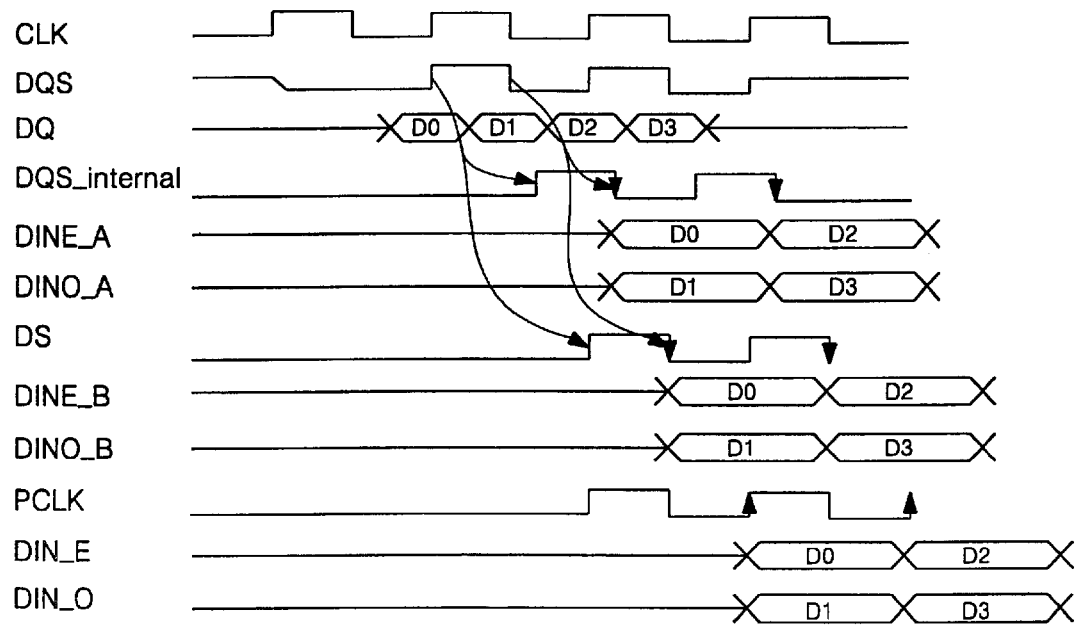
FIG. 7 is a timing diagram of the signals shown in FIG. 6.

FIG. 7 is a timing diagram illustrating the operation of the data latch circuit 611 shown in FIG. 6. As shown in FIG. 7, in the data latch circuit 611 and unlike the data latch circuit 411, the second and seventh flip-flops FF2 and FF7 are simultaneously synchronized with the first internal control signal DQS_internal and outputs the data DINE_A and DINO_A.

Figure 8:
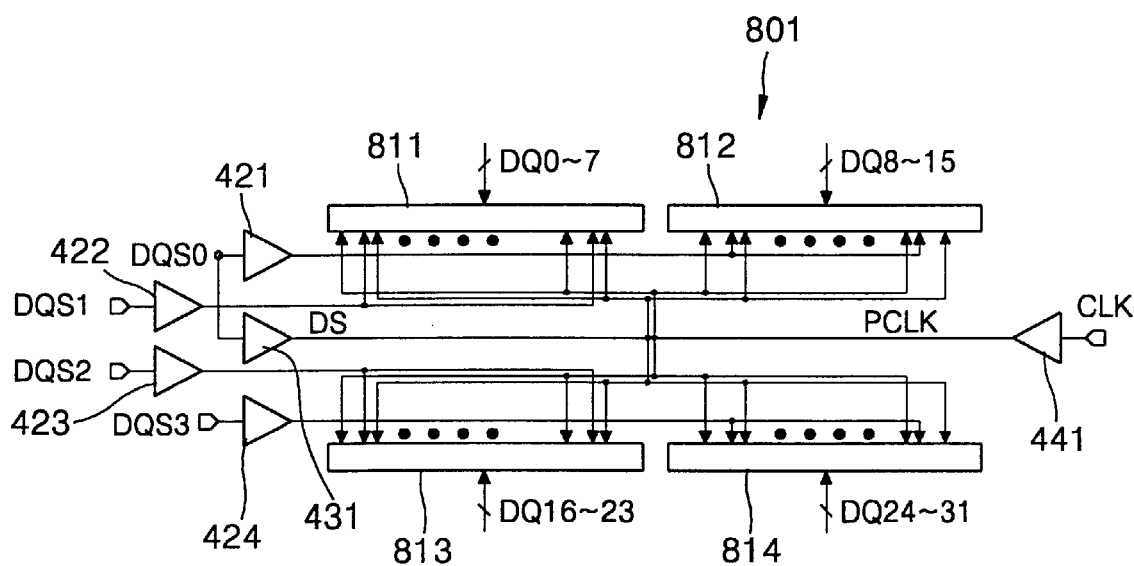
FIG. 8 is a block diagram of a synchronous DRAM semiconductor device according to a third embodiment of the present invention.

FIG. 8 is a block diagram of a synchronous DRAM semiconductor device according to a third embodiment of the present invention. Referring to FIG. 8, a synchronous DRAM semiconductor device 801 includes a plurality of first buffers 421 through 424, second and third buffers 431 and 441, and a plurality of data latch circuits 811 through 814. The data latch circuits 811 through 814 might have the structure of data latch circuit 411 in FIG. 4 or data latch circuit 611 in FIG. 6. The plurality of data latch circuits 811 through 814 operate in synchronization with first internal control signals DQS_internal generated from the plurality of first buffers 421 through 424. In the semiconductor device 801 of FIG. 8, like the semiconductor device 601 the second buffer 431 has the same structure as the third buffer 441. The line load of internal control signals DQS_internal input into the data latch circuits 811 through 814 shown in FIG. 8 is the same as the line load of internal control signals DQS_internal shown in FIG. 6.

Even if the plurality of first buffers 421 through 424 are included for the purpose of controlling the plurality of data latch circuits 811 through 814, the plurality of data latch circuits 811 through 814 are synchronized using the second buffer 421. The second buffer 421 has the same structure as the third buffer 441. The line load of the second buffer 431 is designed to be the same as that of the third buffer 441. Thus, the size of the semiconductor device 801 is not considerably increased, and the valid data window is not decreased.

The semiconductor devices 401, 601, and 801 shown in FIGS. 4, 6, and through 8, respectively, can be effectively applied to double data rate synchronous DRAM semiconductor devices.

According to the present invention, if the buffer 231, which has the same structure as the buffer 241 is used to generate the internal control signal DQS_internal, and data is designed to be input into each of the data latch circuits by the same path, the second internal control signal DS varies by the same amount as the internal clock signal PCLK irrespective of changes in a process, voltage, or temperature. As a result, the valid data window of each of the data latch circuits 411, 611, and 811 through 814 does not decrease. Consequently, the time margin for outputting the effective data of each of the data latch circuits 411, 611, and 811 through 814 responsive to the internal clock signal PCLK increases.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A synchronous DRAM semiconductor device, comprising:
   a first buffer adapted to generate a first internal control signal by delaying an external control signal by a first delay;
   a second buffer adapted to generate a second internal control signal by delaying the external control signal by a second delay, where the first delay is different than the second delay;
   a third buffer adapted to generate an internal clock signal by delaying an external clock signal by a third delay; and
   a data latch circuit adapted to receive external data and generate output data responsive to the first and second internal control signals and the internal clock signal.

2. The synchronous DRAM of claim 1 where a phase of the second internal control signal lags a phase of the first internal control signal.

3. The synchronous DRAM of claim 1 where the second and third buffers have identical structures.

4. The synchronous DRAM of claim 1 where the data latch circuit comprises:
   first and second flip flops adapted to commonly receive internal data responsive to the first internal control signal;
   a third flip flop adapted to receive data output from the first flip flop responsive to the second internal control signal;
   a fourth flip flop adapted to receive data output from the second flip flop responsive to the second internal control signal;
   a fifth flip flop adapted to receive data output from the third flip flop responsive to the internal clock signal; and
   a sixth flip flop adapted to receive data output from the fourth flip flop responsive to the internal clock signal.

5. The synchronous DRAM of claim 4 where the third and fourth flip flops operate responsive to a falling edge of the second internal control signal.

6. The synchronous DRAM of claim 4 where the fifth and sixth flip flops operate responsive to a rising edge of the internal clock signal.

7. The synchronous DRAM of claim 1 where the data latch circuit comprises:
   a first and second flip flops adapted to commonly receive internal data responsive to the first internal control signal;
   a seventh flip flop adapted to receive data output from the first flip flop responsive to first internal control signal;
   a third flip flop adapted to receive data output from the seventh flip flop responsive to the second internal control signal;
   a fourth flip flop adapted to receive data output from the second flip flop responsive to the second internal control signal;
   a fifth flip flop adapted to receive data output from the third flip flop responsive to the internal clock signal; and
   a sixth flip flop adapted to receive data output from the fourth flip flop responsive to the internal clock signal.

8. The synchronous DRAM of claim 7 where the third and fourth flip flops operate responsive to a falling edge of the second internal control signal.

9. The synchronous DRAM of claim 7 where the fifth and sixth flip flops operate responsive to a rising edge of the internal clock signal.

10. The synchronous DRAM of claim 7 where the seventh flip flop is synchronized with a falling edge of the first internal control signal.

11. The synchronous DRAM of claim 1 where a load of the second internal control signal from the second buffer to the data latch circuit is identical to a load of the internal clock signal from the third buffer to the data latch circuit.

12. The synchronous DRAM of claim 1 where a path of the second internal control signal from the second buffer to the data latch circuit is identical to a path of the internal clock signal from the third buffer to the data latch circuit.

13. The synchronous DRAM of claim 1 where the first and third delay are identical.

* * * * *